United States Patent
Naruse et al.

(10) Patent No.: US 7,341,782 B2
(45) Date of Patent: Mar. 11, 2008

(54) POLYMER COMPOSITION CONTAINING ORGANIC MODIFIED LAYERED SILICATE, FILM AND GAS BARRIER FILM AS WELL AS SUBSTRATE AND IMAGE DISPLAY DEVICE USING THEM

(75) Inventors: Hideaki Naruse, Minami-ashigara (JP); Taisei Nishimi, Minami-ashigara (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 10/665,432

(22) Filed: Sep. 22, 2003

(65) Prior Publication Data

US 2004/0116555 A1 Jun. 17, 2004

(30) Foreign Application Priority Data

Sep. 19, 2002 (JP) .............................. 2002-274037

(51) Int. Cl.
- *H01J 1/62* (2006.01)
- *C09K 9/04* (2006.01)
- *B32B 9/04* (2006.01)

(52) U.S. Cl. ................... 428/411.1; 428/917; 313/512; 257/100

(58) Field of Classification Search ................ 428/917, 428/690, 411.1, 141, 331, 332, 338, 150, 428/149; 257/40, 100; 313/512; 523/200, 523/216; 429/917
See application file for complete search history.

(56) References Cited

U.S. PATENT DOCUMENTS

| | | | |
|---|---|---|---|
| 2,892,797 A * | 6/1959 | Alexander et al. ............ 516/79 |
| 4,810,734 A * | 3/1989 | Kawasumi et al. ......... 523/216 |
| 4,889,885 A | 12/1989 | Usuki et al. |
| 5,182,143 A * | 1/1993 | Holmes-Farley et al. ... 427/409 |
| 5,552,469 A | 9/1996 | Beall et al. |
| 6,322,860 B1 * | 11/2001 | Stein et al. ................. 428/1.26 |
| 6,414,069 B1 * | 7/2002 | Pinnavaia et al. .......... 524/445 |
| 6,844,047 B2 * | 1/2005 | Kaminsky et al. .......... 428/141 |
| 6,924,334 B1 * | 8/2005 | Fukatani et al. ............ 524/445 |
| 2001/0025076 A1 * | 9/2001 | Lan et al. .................... 524/445 |
| 2004/0220309 A1 * | 11/2004 | Nishimi et al. ............. 524/274 |

FOREIGN PATENT DOCUMENTS

| | | | |
|---|---|---|---|
| JP | 04-080030 A | | 3/1992 |
| JP | 06-192454 | * | 12/1994 |
| JP | 07-070357 A | | 3/1995 |
| JP | 09-309720 A | | 12/1997 |
| JP | 10-086269 | * | 7/1998 |
| JP | 10-206835 A | | 8/1998 |

* cited by examiner

*Primary Examiner*—Milton I. Cano
*Assistant Examiner*—Camie S. Thompson
(74) *Attorney, Agent, or Firm*—Sughrue Mion, PLLC

(57) ABSTRACT

A polymer composition includes a polymer having a glass transition temperature of 120° C. to 400° C. as a simple substance of the polymer and an organic modified layered silicate having a decomposition starting temperature of 190° C. to 350° C. and contained in the polymer. (1) A film including the polymer composition, (2) a gas barrier film including the film and an organic/inorganic hybrid layer obtained by the sol-gel method and provided on the film, (3) a substrate comprising the film or the gas barrier film, and (4) an image display device comprising at least an anode, a light-emitting organic thin film layer and a cathode on the film or the gas barrier film are also disclosed. A polymer composition having both superior heat resistance and superior gas baffler properties, a film comprising the polymer composition, and a gas baffler film having the film, as well as a substrate and image display device exhibiting superior precision and durability are provided.

15 Claims, No Drawings

POLYMER COMPOSITION CONTAINING ORGANIC MODIFIED LAYERED SILICATE, FILM AND GAS BARRIER FILM AS WELL AS SUBSTRATE AND IMAGE DISPLAY DEVICE USING THEM

TECHNICAL FIELD

The present invention relates to a polymer composition containing an organic modified layered silicate (henceforth referred to as "polymer composition"), a film comprising the polymer composition, a gas barrier film, a gas barrier film, a substrate and an image display device.

More precisely, the present invention relates to a polymer composition having both of superior heat resistance and superior gas barrier property and a film comprising the polymer composition, as well as a gas barrier film, substrate and image display device having the film.

RELATED ART

With the wide spread of personal computers and portable information terminals, the demand for a thin and light electronic display is rapidly increasing. Currently, glass substrates are mainly used in the liquid crystal display devices, which are widely spread, and in the organic EL devices, which draw attentions because of their high visibility due to the self-coloring property. In view of production of lighter devices, impact resistance, flexibility thereof and so forth, it is preferred that flexible plastic substrates are used as substrates of liquid crystal devices and organic EL devices. However, plastic substrates have poorer heat resistance and gas barrier property compared with glass substrates. Therefore, they suffer from disadvantages that they are unsuitable for preparation of high definition patterns and that their durability is poor.

Many researches to improve such drawbacks of plastic substrates have been reported so far. For example, techniques for improving gas barrier property have been reported in Japanese Patent Laid-open Publication (KOKAI) Nos. 2001-205743, 7-251489, 2000-343659 and so forth (see, for example, Patent documents 1 to 3 mentioned below).

Japanese Patent Laid-open Publication No. 2001-205743 discloses an example of use of a plastic substrate having a multilayer structure constituted by layers comprising layered compounds in a liquid crystal display device. This patent document describes that heat resistance, hardness and anti-gas permeability are improved by the use of the layered compounds. However, the gas barrier property described therein is not sufficient, and further improvement is required.

Further, Japanese Patent Laid-open Publication No. 7-251489 discloses a laminated film provided with a layer of a composition comprising a layered inorganic compound having a specific aspect ratio and a resin between layers of polyolefin type resin in order to reconcile moisture proofing property and oxygen barrier property. Furthermore, Japanese Patent Laid-open Publication No. 2000-343659 discloses a film having a gas barrier layer comprising a mixture of partial hydrolysate of alkoxide condensate and a water-soluble polymer.

However, all of these could not yet provide sufficient oxygen barrier property under high humidity, and the gas barrier property of the whole laminated films needs to be further improved for use in liquid crystal display substrates or organic EL substrates.

On the other hand, as a technique for improving heat resistance, Japanese Patent Laid-open Publication No. 2000-323273 can be mentioned. Japanese Patent Laid-open Publication No. 2000-323273 discloses an example of use of a film obtained by laminating a silicon oxide thin film and an organic/inorganic hybrid film formed by the sol-gel method on a polyethylene terephthalate (PET) film in a base material and protective layer for organic EL devices. However, since the glass transition temperature (henceforth referred to as "Tg") of PET is 100° C. or lower, heat resistance is not sufficient.

Meanwhile, as a class of resins exhibiting high transparency and low water absorption, olefin metathesis polymers that are obtained by metathesis polymerization reaction of olefin metathesis-reactive monomers have been conventionally known, and attempts for improving heat resistance etc. of the olefin metathesis polymers have also been conducted. For example, Japanese Patent Laid-open Publication No. 2-6525 discloses a reinforcement method in which glass fibers are distributed in an olefin metathesis polymer to improve strength, elastic modulus, heat resistance etc. of molded articles.

However, in the case of the aforementioned method, it is difficult to obtain sufficient reinforcement effect only with glass staples. Therefore, it becomes necessary to use continuous glass fibers, glass clothes etc. in combination. Thus, there are problems that obtained molded articles suffer from remaining voids or dimensional variations when precision molding is performed or a molding method in which the resin is poured into a mold such as casting molding, and heat resistance of molded articles is not necessarily sufficient.

In order to solve this problem, Japanese Patent Laid-open Publication No. 2001-302888 discloses a technique of incorporating a layered compound into an olefin metathesis polymer resin. However, sufficient kneading with a cyclic polyolefin type compound cannot be obtained by the technique disclosed in this patent document, and therefore heat resistance cannot be obtained in a degree required for liquid crystal display substrates or organic EL substrates.

SUMMARY OF THE INVENTION

The present invention was accomplished in view of the aforementioned problems. The first object of the present invention is to provide a polymer composition having both of superior heat resistance and superior gas barrier property and a film comprising the polymer composition. The second object of the present invention is to provide a gas barrier film having both of superior heat resistance and superior gas barrier property. The third object of the present invention is to provide a substrate and image display device exhibiting superior precision and durability.

The inventors of the present invention conducted various researches to develop a polymer composition having both of favorable heat resistance and favorable gas barrier property, and showing favorable precision and durability when it is used for image display devices such as liquid crystal display substrates and organic EL substrates. As a result, they successfully developed a polymer composition having both of superior heat resistance and superior gas barrier property by adding a specific organic modified layered silicate to a specific polymer, and thus accomplished the present invention.

That is, the first object of the present invention is achieved by the following polymer composition.

(1) A polymer composition comprising a polymer having Tg of 120° C. to 400° C. as a simple substance of the polymer and an organic modified layered silicate having a decomposition starting temperature of 190° C. to 350° C. and contained in the polymer.
(2) A polymer composition comprising a polymer having Tg of 160° C. to 300° C. as a simple substance of the polymer and an organic modified layered silicate having a decomposition starting temperature of 250° C. to 350° C. and contained in the polymer.
(3) The polymer composition according to (1) or (2), wherein the polymer is an olefin metathesis polymer.
(4) The polymer composition according to (3), wherein olefin metathesis-reactive monomers forming the olefin metathesis polymer comprise a norbornene type monomer and/or a monocyclic cycloolefin type monomer.
(5) The polymer composition according to any one of (1) to (4), wherein the organic modified layered silicate comprises a tetraalkylphosphonium compound and/or a quaternary salt of nitrogen-containing heterocyclic compound.

The first object of the present invention is further achieved also by a film comprising the polymer composition.

The second object of the present invention is achieved by a gas barrier having the aforementioned film.
(1) A gas barrier film comprising the aforementioned film and an organic/inorganic hybrid layer obtained by the sol-gel method and provided on the film.
(2) The gas barrier film according to (1), which further has a film comprising a polymer on the organic/inorganic hybrid layer.
(3) The gas barrier film according to (2), wherein the film comprising a polymer is the aforementioned film.
(4) The gas barrier film according to any one of (1) to (3), which shows a gaseous oxygen transmission rate of 10 ml/m$^2$·day·atm or less at 23° C., 90% RH.

The third object of the present invention is achieved by a substrate having the aforementioned film or the aforementioned gas barrier film, and an image display device having the aforementioned film or the aforementioned gas barrier film.

The substrate and image display device of the present invention are or are used for, for example, a liquid crystal device, organic EL device or the like. Since they are produced by using the flexible gas barrier film of the present invention, they show high precision and high durability.

BEST MODE FOR CARRYING OUT THE INVENTION

Hereafter, the polymer composition, film, gas barrier film, substrate and image display device of the present invention will be explained in detail.

In the present specification, ranges indicated with "to" mean ranges including the numerical values before and after "to" as the minimum and maximum values.

[Polymer Composition]

<Polymer having Tg of 120° C. to 400° C.>

The polymer used for the present invention has Tg in the range of 120° C. to 400° C., preferably 160° C. to 300° C., more preferably 180° C. to 250° C., as a simple substance of the polymer. If a polymer having Tg lower than 120° C. as a simple substance of the polymer is contained, sufficient share is not applied during kneading, and thus dispersibility is unfavorably degraded. On the other hand, if a polymer having Tg higher than 400° C. as a simple substance of the polymer is contained, thermal decomposition of the polymer composition is unfavorably caused.

The "simple substance of the polymer" used in this specification means the polymer in a state that the polymer does not contain the organic modified layered silicate for significantly changing Tg (by 10° C. or more), and it may contain an initiator, plasticizer or the like.

Examples of plastic materials having Tg of 120° C. to 400° C. as a simple substance of polymer and can become a transparent film include, for example, polycarbonate (Tg: 160° C.), cycloolefin polymer (Tg: e.g., 163° C.), polyalylate (Tg: 193° C.), polyether sulphone (Tg: 225° C.), olefin metathesis polymer (Tg: e.g., 200° C. in the case of norbornene polymer) and so forth. If the polymer is subjected to fusion kneading, it is preferably a thermoplastic resin, particularly preferably an olefin metathesis polymer.

<Olefin Metathesis Polymer>

The olefin metathesis polymer that can be used as a polymer in the polymer composition of the present invention in not particularly limited, so long as it can be obtained by an olefin metathesis reaction. The olefin metathesis reaction referred to herein means a reaction in which alkylidene groups of olefins are exchanged as shown by the following formula.

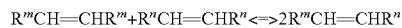

In the formula, R'''CH=CHR''' and R''CH=CHR'' represent an olefin metathesis-reactive monomer, respectively.

Olefin metathesis-reactive monomers that can be used for the present invention are not particularly limited. For example, unsaturated chain-like olefins having at least one unsaturated double bond, such as propylene and butadiene, unsaturated cyclic olefins having at least one unsaturated double bond, such as cyclooctene, cyclooctadiene and norbornene, and so forth can be used.

These olefin metathesis-reactive monomers can be used as single kind of monomers or may be used as a combination of two or more kinds of them.

Among the aforementioned olefin metathesis-reactive monomers, norbornene type monomers can be preferably used, which show high metathesis reactivity and exhibit superior mechanical properties such as rigidity of olefin metathesis polymer to be obtained. Monocyclic cycloolefins, which provide superior physical properties such as flexibility of olefin metathesis polymer to be obtained, can be more preferably used.

The aforementioned norbornene type monomers and monocyclic cycloolefins can be each independently used, or the both can also be used together.

Although the aforementioned norbornene type monomers are not particularly limited, there can be used, for example, bicyclic compounds such as norbornene, ethylidene norbornene and norbornadiene; tricyclic compounds such as dicyclopentadiene and dihydrodicyclopentadiene; tetracyclic compounds such as tetracyclododecene, ethylidene tetracyclododecene and phenyltetracyclododecene; pentacyclic compounds such as tricyclopentadiene; heptacyclic compounds such as tetracyclopentadiene, alkyl-substituted compounds thereof (for example, methyl-, ethyl-, propyl-, butyl-substituted compounds etc.), alkylidene-substituted compounds thereof (for example, ethylidene-substituted compounds etc.), aryl-substituted compounds thereof (for example, phenyl-, tolyl-substituted compounds etc.), derivatives thereof having a polar group such as epoxy group, methacryl group, hydroxyl group, amino group, carboxyl group, cyano group, a halogen group, an ether group and an ester bond-containing group, and so forth.

Among the aforementioned norbornene type monomers, dicyclopentadiene, dicyclopentadiene derivatives, norbornene, ethylidenenorbornene and norbornadiene are preferred, and dicyclopentadiene is particularly preferred. These norbornene type monomers can be used as a single kind of monomers, or two or more kinds of them can also be used together.

The monocyclic cycloolefins are not also particularly limited, and examples thereof include, for example, cyclobutene, cyclopentene, cyclooctene, cyclododecene, cyclopentadiene, cyclooctadiene and so forth. Among these, cyclooctadiene is preferred.

These monocyclic cycloolefins can be used as a single kind of monomers, or two or more kinds of them can also be used together.

Catalyst that can be used for the present invention for the metathesis polymer is not particularly limited, so long as it is not inactivated in the presence of oxygen, moisture, functional groups or the like and can cause metathesis polymerization of the olefin metathesis-reactive monomers mentioned above under an ordinary condition in which oxygen, moisture or the like exists. For example, the metathesis polymerization catalyst disclosed in Japanese Patent Laid-open Publication No. 2001-302888 can be used.

<Organic Modified Layered Silicate>

The polymer composition of the present invention comprises an organic modified layered silicate showing a decomposition starting temperature of 190° C. to 350° C. in the polymer. The decomposition starting temperature is a temperature at which weight of an organophilizing agent is decreased by 1% relative to the total weight of an organic modified layered silicate when the temperature is increased at a rate of 10° C./min in an argon atmosphere by using the Thermo Plus system produced by Rigaku International.

Decomposition starting temperature of the conventional organic modified layered silicates (for example, organic modified layered silicates utilizing a tetraalkylammonium salt as an organophilizing agent) is lower than 190° C. However, the decomposition starting temperature of the organic modified layered silicate used in the present invention is 190° C. to 350° C. Because of the above, even if the composition of the present invention is subjected to fusion kneading with a polymer having a melting point of 190° C. or higher, it is hardly thermally decomposed, and superior thermal stability can be obtained. Further, if the decomposition starting temperature is 350° C. or lower, thermal decomposition of the organic modified layered silicate can be minimized. The decomposition starting temperature of the organic modified layered silicate used in the present invention is preferably 250° C. to 350° C., more preferably 250° C. to 300° C.

Examples of the organic modified layered silicate used in the present invention include, for example, organic modified layered silicates containing a tetraalkylphosphonium compound, triphenylphosphonium compound, tetraphenylphosphonium compound, a quaternary salt of nitrogen-containing or heterocyclic compound, and organic modified layered silicates comprising a tetraalkylphosphonium compound or a quaternary salt of nitrogen-containing heterocyclic compound are particularly preferred.

The aforementioned organic modified layered silicates can be used in each kind or as a mixture of two or more kinds of them.

The aforementioned tetraalkylphosphonium compound is an organic cationic compound in which four alkyl groups are covalently bonded to phosphonium (P) group. Although the type of the tetraalkylphosphonium compound is not particularly limited, tetraalkylphosphonium compounds represented by the following formula (I) can be preferably used for the present invention.

(I)

$R^1$ to $R^4$ in the formula (I) represent a straight alkyl group, branched alkyl group or cyclic alkyl group having one or more carbon atoms, and they may be the same or different.

Examples of the straight alkyl group as $R^1$ to $R^4$ in the aforementioned formula (I) include, for example, methyl group, ethyl group, propyl group, n-butyl group, n-pentyl group, n-hexyl group, n-heptyl group, n-octyl group, n-nonyl group, n-decyl group, n-undecyl group, n-dodecyl group, n-tridecyl group, n-tetradecyl group, n-pentadecyl group, n-hexadecyl group, n-octadecyl group, n-nonadecyl group, n-eicosyl group and so forth.

Examples of the branched alkyl group as $R^1$ to $R^4$ in the aforementioned formula (I) include, for example, isopropyl group, sec-butyl group, tert-butyl group, neopentyl group, 2-ethylhexyl group, 2-hexyldecyl group and so forth. Further, examples of the cyclic alkyl group as $R^1$ to $R^4$ mentioned above include, for example, cyclopropyl group, cyclobutyl group, cyclopentyl group, cyclohexyl group, cycloheptyl group, cyclooctyl group and so forth.

$R^1$ to $R^4$ mentioned above may contain an unsaturated bond (double bond and triple bond), ester group, amide group, ether group, phenylene group or the like as a partial structure.

$R^1$ to $R^4$ mentioned above may be the same or different so long as they represent a straight alkyl group, branched alkyl group or cyclic alkyl group having one or more carbon atoms. It is preferred that, in the aforementioned formula (I), $R^1$ to $R^3$ represent a straight alkyl group, branched alkyl group or cyclic alkyl group having three or more carbon atoms, more preferably n-butyl group, n-hexyl group or n-octyl group, and $R^4$ represents a straight alkyl group, branched alkyl group or cyclic alkyl group having one or more carbon atoms. It is also preferred that $R^1$ to $R^3$ mentioned above represent a straight alkyl group, branched alkyl group or cyclic alkyl group having one or more carbon atoms, more preferably methyl group or ethyl group, and $R^4$ represents a straight alkyl group, branched alkyl group or cyclic alkyl group having three or more carbon atoms, more preferably a straight alkyl group having ten or more carbon atoms. It is further preferred that $R^1$ to $R^4$ mentioned above represent the same straight alkyl group, branched alkyl group or cyclic alkyl group.

As for the tetraalkylphosphonium compound used in the present invention, the tetraalkylphosphonium compounds represented by the aforementioned general formula (I) can be used in each kind or as a combination of two or more kinds of them.

The aforementioned tetraalkylphosphonium compounds can usually be obtained by reacting a halogenated alkyl with a trialkylphosphine. In view of ease of synthesis, it is preferable to react a halogenated alkyl having a straight, branched or cyclic alkyl group having three or more carbon atoms with a trialkylphosphine having straight, branched or cyclic alkyl groups having one or more carbon atoms. Further, in view of safety of human body, it is preferable to use a trialkylphosphine having straight, branched or cyclic alkyl groups having three or more carbon atoms, preferably four or more carbon atoms, because trimethylphosphine and triethylphosphine are highly toxic.

As trialkylphosphines serving as the starting materials of the aforementioned tetraalkylphosphonium compounds, commercially available compounds can be used. Examples of such commercially available compounds include, for example, tri-n-butylphosphine, tri-n-hexylphosphine, tri-n-octylphosphine, tricyclohexylphosphine and so forth.

Specific examples of the organophilizing agent of the phosphonium type compound, which can be used in the composition of the present invention, include the followings.

P-1

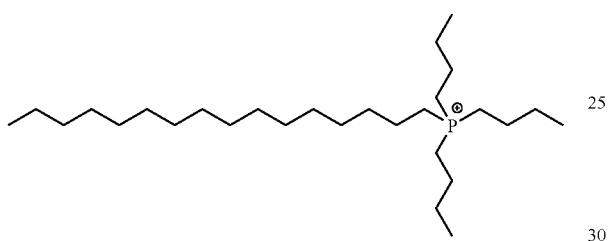

P-2

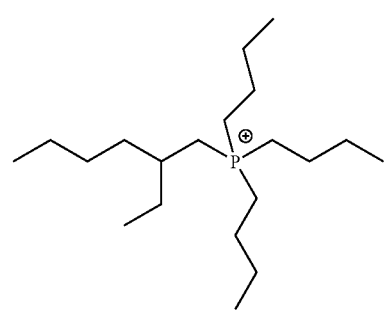

P-3

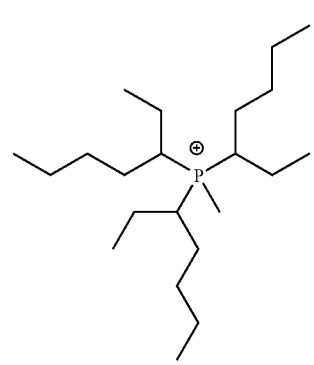

P-4

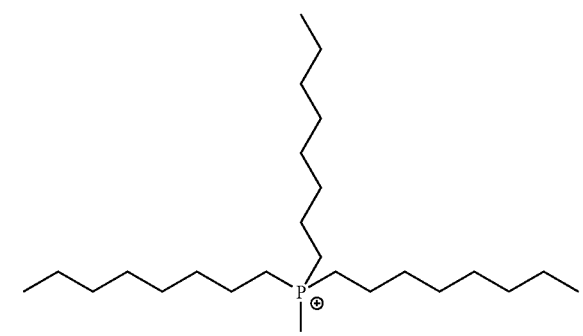

P-5

P-6

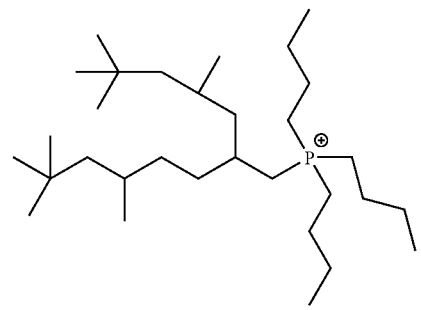

P-7

P-8

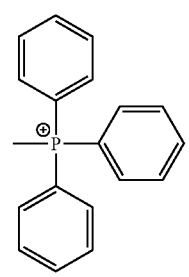

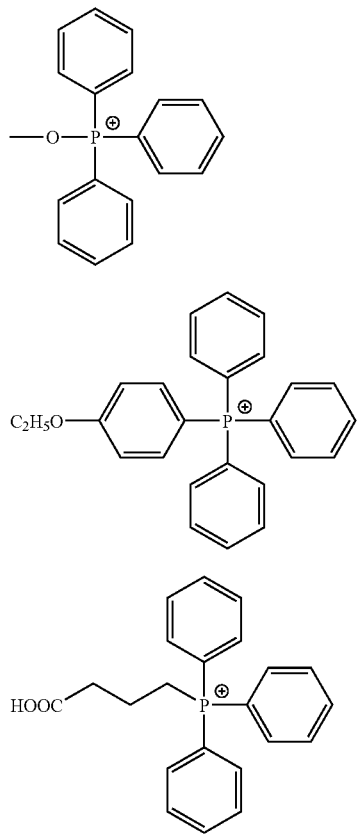

P-9

P-10

P-11

The quaternary salt of nitrogen-containing heterocyclic compound which can be used as an organophilizing agent of the organic modified layered silicate used in the present invention is not particularly limited, so long as it is a compound obtained by quaternizing a nitrogen atom of a cyclic compound containing nitrogen. However, it is preferably a compound obtained by quaternizing a nitrogen atom constituting a heterocyclic ring. Although the number of elements constituting the heterocyclic ring is not particularly limited, the heterocyclic ring is preferably a 4- to 10-membered ring, more preferably 5- to 8-membered ring. The heterocyclic ring may be saturated or unsaturated, and it may be an aromatic ring. Further, the heterocyclic ring may contain oxygen atom or sulfur atom in addition to nitrogen atom and carbon atom.

Examples of nitrogen-containing 6-membered ring aromatic compound usable in the present invention include pyridine, 2-picoline, 3-picoline, 4-picoline, 2,3-lutidine, 2,4-lutidine, 2,5-lutidine, 2,6-lutidine, 3,5-lutidine, 2,4,6-collidine and so forth, and a nitrogen-containing 6-membered ring aromatic compound having a substituent at a position other than the 1-position is preferred.

Examples of nitrogen-containing 5-membered ring aromatic compound include, for example, pyrrole, pyrazole, imidazole, triazole, tetrazole, isoxazole, oxazole, thiazole, indole, indazole, benzimidazole, benzotriazole, benzisoxazole, benzoxazole, benzothiazole, derivatives thereof and so forth.

Examples of nitrogen-containing non-aromatic type compound include, for example, pyrrolidine, piperidine, piperazine, morpholine, decahydroquinoline, decahydroisoquinoline, indoline, isoindoline, pyrrolidine, quinolizine, quinuclidine, 1,4-diazabicyclo[2,2,2]octane and so forth.

In order that the organic modified layered silicate of the present invention may exhibit favorable thermal stability, the aforementioned nitrogen-containing heterocyclic compound preferably has at least one alkyl group having a length exceeding a certain chain length as a substituent. The aforementioned nitrogen-containing heterocyclic compound more preferably has such alkyl groups on the nitrogen atom forming a quaternary salt of the nitrogen-containing heterocyclic compound.

The alkyl group is preferably an alkyl group having 4 to 100 carbon atoms, more preferably an alkyl group having 8 to 50 carbon atoms, further preferably an alkyl group having 12 to 30 carbon atoms. The alkyl group may have a straight, branched, cyclic or unsaturated structure.

Substituents on the nitrogen atom forming a quaternary salt and the other atoms are not particularly limited so long as the nitrogen-containing heterocyclic compound has at least one of the aforementioned alkyl group having a length exceeding a certain chain length, and the compound may have any substituent or may not have any other substituents. Preferred examples of the substituents include a halogen, an alkyl group, alkenyl group, alkynyl group and aryl group having 8 or less carbon atoms in total, and hydrogen (unsubstituted).

Preferred examples of the alkyl group as a substituent of the aforementioned nitrogen-containing heterocyclic compound include, for example, n-butyl group ($C_4$), n-pentyl group ($C_5$), n-hexyl group ($C_6$), n-heptyl group ($C_7$), n-octyl group ($C_8$), 2-ethylhexyl group ($C_8$), n-nonyl group ($C_9$), decyl group ($C_{10}$), tetradecyl group ($C_{14}$), hexadecyl group ($C_{16}$), octadecyl group ($C_{18}$), 2-hexyldecyl group and so forth. Further, the alkyl group may contain an unsaturated bond (double bond or triple bond), an ester group, an amide group, an ether group, a phenylene group or the like as a partial structure.

The quaternary salts of the aforementioned nitrogen-containing heterocyclic compounds can be used in each kind or as a combination of two or more kinds of them.

The quaternary salts of the aforementioned nitrogen-containing heterocyclic compounds can be obtained by reacting a halogenated alkyl with the nitrogen atom of the aforementioned nitrogen-containing heterocyclic compound. As the nitrogen-containing heterocyclic compounds serving as starting materials of the quaternary salts of the nitrogen-containing heterocyclic compounds, commercially available compounds can be used.

Specific examples of the quaternary salts of the nitrogen-containing heterocyclic compounds usable in the composition of the present invention include the followings. However, the quaternary salts of the nitrogen heterocyclic compounds usable in the present invention are not limited to these compounds.

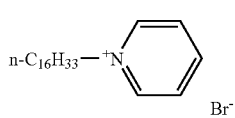

N-1

-continued

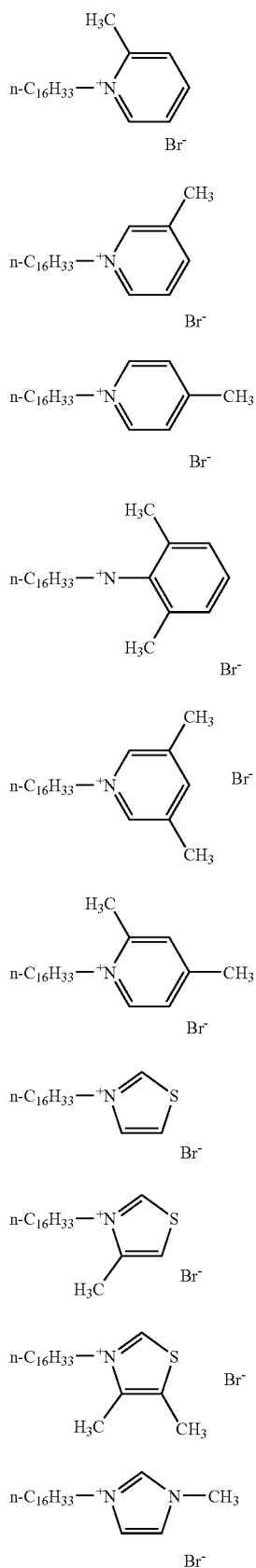

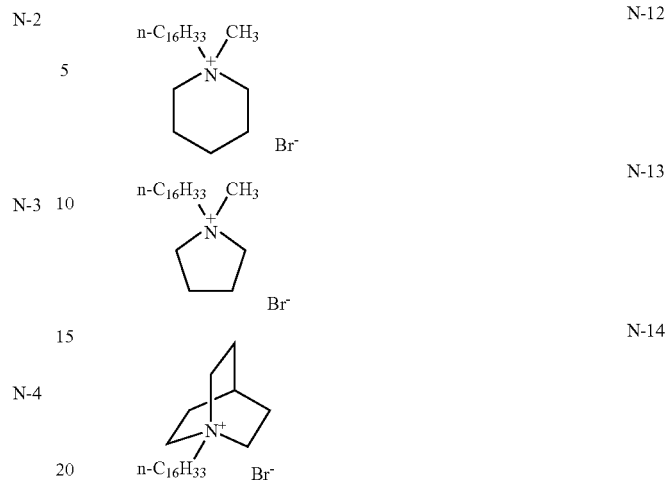

Although the layered silicate contained in the organic modified layered silicate is not particularly limited, clay minerals having swelling property and/or cleavage property, hydrotalcite compounds and other similar compounds are preferred. Examples of such clay minerals includes kaolinite, dickite, nacrite, halloysite, antigorite, chrysotile, pyrophyllite, montmorillonite, beidellite, nontronite, saponite, sauconite, stevensite, hectorite, tetrasilylic mica, sodium taeniolite, muscovite, margarite, talc, vermiculite, phlogopite, xanthophyllite, chlorite and so forth.

The aforementioned layered silicates may be either natural substances or synthesized substances. These layered silicates may be used in each kind, or two or more kinds of them may be used together.

Shape of the aforementioned layered silicate is not particularly limited. However, since cleavage of layered silicate having a lot of layers becomes difficult after organification thereof, thickness of the layered silicate not organophilized is preferably a thickness of one layer (about 1 nm) as far as possible. The average length thereof is 0.01 to 50 μm, preferably 0.05 to 10 μm, and a layered silicate having an aspect ratio of 20 to 500, preferably 50 to 200, can be preferably used.

The aforementioned layered silicate has ion-exchangeable inorganic cations between layers. The ion-exchangeable inorganic cations mean metal ions such as those of sodium, potassium and lithium existing on crystal surfaces of the layered silicate. These ions exhibit a property that they can be exchanged with a cationic substance, and thus various substances having a cationic property can be inserted (intercalated) between the layers of the aforementioned layered silicate by an ion exchange reaction.

Although the cation exchange capacity (CEC) of the aforementioned layered silicate is not particularly limited, it is, for example, preferably 25 to 200 meq/100 g, more preferably 50 to 150 meq/100 g, further preferably 90 to 130 meq/100 g. If the cation exchange capacity of the layered silicate is less than 25 meq/100 g, amount of cationic substance that can be inserted (intercalated) between layers of the layered silicate by ion exchange becomes small, and the layers may not be sufficiently organophilized for each other. On the other hand, if the cation exchange capacity exceeds 200 meq/100 g, bonding strength between layers of the layered silicate becomes too strong. Thus, cleavage of crystal leaves becomes difficult, and dispersibility may be degraded.

Examples of the layered silicate satisfying the aforementioned requirements include, for example, marketed products such as Sumecton SA produced Kunimine Industries, Kunipia F produced by Kunimine Industries, Somasif ME-100 produced by CO-OP Chemical and Lucentite SWN produced by CO-OP Chemical.

Although the method for incorporating an organophilizing agent between layers of the layered silicate is not particularly limited, a method of incorporating the organophilizing agent by exchanging inorganic cations with the organophilizing agent through an ion exchange reaction is preferred in view of ease of synthesis operation. The method for ion exchange of the ion-exchangeable inorganic cations of the layered silicate with the organophilizing agent is not particularly limited, and a known method can be used. Specifically, methods of performing ion exchange in water, ion exchange in alcohol, ion exchange in a mixed solvent of water and alcohol and so forth can be used.

Specifically, a layered silicate is sufficiently solvated with water, alcohol or the like, then added with an organophilizing agent and stirred to substitute the organophilizing agent for metal ions between layers of the layered silicate. Then, non-substituted organophilizing agent is sufficiently washed off, and the layered silicate is collected by filtration and dried. In addition, it is also possible to directly react a layered silicate with organic cations in an organic solvent or to react a layered silicate and organophilizing agent with heating and kneading in an extruder in the presence of a resin or the like.

The ion exchange is preferably performed at a temperature in the range of 0° C. to 100° C., more preferably 10° C. to 80° C., further preferably 15° C. to 60° C.

Advance state of the aforementioned ion exchange can be confirmed by a known method. For example, substitution of the organophilizing agent in the layered silicate can be confirmed by a method of confirming exchanged inorganic ions in filtrate by the ICP emission spectrometry, a method of confirming increase of spacing between layers of layered silicate by X-ray analysis, a method of confirming existence of organophilizing agent based on mass reduction during temperature-increasing measured by using a thermobalance or the like. The degree of the ion exchange is preferably 0.05 eq (5%) or more, more preferably 0.1 eq (10%) or more, further preferably 0.5 eq (50%) or more, for 1 eq of ion-exchangeable inorganic ions in the layered silicate.

In the present invention, by fusion kneading of the layered silicate obtained as described above and a polymer having a specific Tg, or mixing them in a solution, a composition in which the organic layered compound in a cleaved state is dispersed in the polymer can be obtained. Inter alia, the fusion kneading method is preferred in view of the process and cost. Further, as the fusion kneading apparatus used for the fusion kneading, kneading apparatuses generally used for thermoplastic resins can be used. For example, a single or multi-screw kneading extruder, roller, Banbury mixer and so forth may be used as the kneading apparatus.

The mixing ratio of the organic modified layered silicate and the polymer is preferably 1/100 to 100/20, more preferably 5/100 to 100/50, in terms of a weight ratio. If the mixing ratio is less than 1/100, sufficient heat resistance and gas barrier property may not be obtained. On the other hand, if the mixing ratio becomes larger than 100/20, dispersibility of the aforementioned organic modified layered silicate and the polymer may be markedly degraded.

[Film Comprising Polymer Composition]

The film of the present invention comprises the polymer composition of the present invention. The film of the present invention may be added with ingredients other than the polymer composition of the present invention (e.g., additives such as antistatic agents). The film of the present invention is obtained by making the polymer composition of the present invention into the shape of film using an ordinary fusion extrusion method, calendar method, solution casting method or the like. Further, the film of the present invention may be monoaxially or biaxially stretched. The film of the present invention may be subjected to corona discharge treatment, glow discharge treatment, UV treatment, plasma treatment or the like to improve adhesion with a coated layer.

Although the thickness of the film of the present invention can be suitably determined depending on the purpose, it is preferably 10 to 300 µm, more preferably 50 to 250 µm. If the thickness is smaller than 10 µm, strength becomes insufficient, and handling becomes difficult. If the thickness is larger than 300 µm, transparency and flexibility tend to be degraded.

The gas barrier property of the film of the present invention can be represented by oxygen transmission rate and water vapor transmission rate. The oxygen transmission rate is 0.005 to 100 ml/$m^2$·day·atm, preferably 0.005 to 50 ml/$m^2$·day·atm, more preferably 40 ml/$m^2$·day·atm, in an environment of 23° C., 0% RH. The water vapor transmission rate is 0.005 to 0.3 g/$m^2$·day, preferably 0.005 to 0.25 g/$m^2$·day, more preferably 0.005 to 0.20 g/$m^2$·day.

[Gas Barrier Film]

The gas barrier film of the present invention has an organic/inorganic hybrid layer obtained by the sol-gel method on the aforementioned film.

The "organic/inorganic hybrid" referred to in this specification means a state that an inorganic substance and an organic substance is mixed at a molecular level and nano order level, and refers to, for example, composite materials of an organic material and inorganic material obtained by the sol-gel methods described in Adv. Polym. Sci., 100, 11 (1992); Poly. Mater. Encyclopedia, 6, 4793 (1996); and Current Opinion in Solid State & Materials Science, 1, 806 (1996).

The gas barrier film of the present invention is a functional film exhibiting an oxygen transmission rate of 0.005 to 10 ml/$m^2$·day·atm at 23° C., 90% RH, and it is preferably a film exhibiting an oxygen transmission rate of 0.005 to 3 ml/$m^2$·day·atm, more preferably 0.005 to 0.8 ml/$m^2$·day·atm, still more preferably 0.005 to 0.65 ml/$m^2$·day·atm, at 23° C., 90% RH. Further, the gas barrier films of the present invention is a functional film having a water vapor transmission rate of 0.005 to 0.16 g/$m^2$·day at 23° C., 90% RH, and it is preferably a functional film having a water vapor transmission rate of 0.005 to 0.15 g/$m^2$·day, more preferably 0.005 to 0.13 g/$m^2$·day, at 23° C., 90% RH.

The gas barrier film of the present invention can be used as a substrate for display, electronic circuit and so forth. It can also be used as a packaging material requiring heat resistance and gas shielding for deoxidization, prevention of odor or the like (e.g., packaging sheets and bottles (for example, packing sheets of retort foods to be subjected to heating by a microwave oven or the like such as those for miso soup, packed boiled rice, curry and ramen noodles) and so forth.

The organic/inorganic hybrid layer in the gas barrier film of the present invention can be obtained by allowing an organic material to coexist with an inorganic material during, before or after a reaction of the inorganic material by using the sol-gel method. In the sol-gel method used for manufacture of the gas barrier film of the present invention, a metal alkoxide is hydrolyzed and polycondensed preferably in a solution or coated film to obtain a dense thin film. Further, in this operation, a resin may also be used together to obtain an organic/inorganic hybrid material.

As the metal alkoxide used in the sol-gel method, alkoxysilanes and/or metal alkoxides other than alkoxysilane can be used. As the metal alkoxides other than alkoxysilane, zirconium alkoxides, titanium alkoxides, aluminum alkoxides and so forth are preferred.

Examples of alkoxysilane include the alkoxysilanes represented by the following formula.

$$Si(OR^1)_x(R^2)_{4-x}$$

In the above formula, $R^1$ preferably represents an alkyl group having 1 to 5 carbon atoms or an acyl group having 1 to 4 carbon atoms. Examples include, for example, methyl group, ethyl group, n-propyl group, isopropyl group, n-butyl group, sec-butyl group, tert-butyl group, acetyl group and so forth. $R^2$ preferably represents an organic group having 1 to 10 carbon atoms. Examples include, for example, an unsubstituted hydrocarbon group such as methyl group, ethyl group, n-propyl group, isopropyl group, n-butyl group, tert-butyl group, n-hexyl group, cyclohexyl group, n-octyl group, tert-octyl group, n-decyl group, phenyl group, vinyl group and allyl group and a substituted hydrocarbon group such as γ-chloropropyl group, $CF_3CH_2$—, $CF_3CH_2CH_2$—, $C_2F_5CH_2CH_2$—, $C_3F_7CH_2CH_2CH_2$—, $CF_3OCH_2CH_2CH_2$—, $C_2F_5OCH_2CH_2CH_2$—, $C_3F_7OCH_2CH_2CH_2$—, $(CF_3)_2CHOCH_2CH_2CH_2$—, $C_4F_9CH_2OCH_2CH_2CH_2$—, 3-(perfluorocyclohexyloxy)propyl group, $(CF_2)_4CH_2OCH_2CH_2CH_2$—, $H(CF_2)_4CH_2CH_2CH_2$—, γ-glycidoxypropyl group, γ-mercaptopropyl group, 3,4-epoxycyclohexylethyl group and γ-methacryloyloxypropyl group. X is preferably an integer of 2 to 4.

Specific examples of these alkoxysilanes are shown below. Examples of the compounds where x=4 include tetramethoxysilane, tetraethoxysilane, tetra-n-propoxysilane, tetraisopropoxysilane, tetra-n-butoxysilane, tetraacetoxysilane and so forth.

Examples of the compounds where x=3 include methyltrimethoxysilane, methyltriethoxysilane, ethyltrimethoxysilane, ethyltriethoxysilane, n-propyltrimethoxysilane, n-propyltriethoxysilane, isopropyltrimethoxysilane, isopropyltriethoxysilane, γ-chloropropyltrimethoxysilane, γ-chloropropyltriethoxysilane, γ-glycidoxypropyltrimethoxysilane, γ-glycidoxypropyltriethoxysilane, γ-methacryloyloxypropyltrimethoxysilane, γ-mercaptopropyltriethoxysilane, phenyltrimethoxysilane, vinyltriethoxysilane, 3,4-epoxycyclohexylethyltrimethoxysilane, 3,4-epoxycyclohexylethyltriethoxysilane, $CF_3CH_2CH_2Si(OCH_3)_3$, $C_2F_5CH_2CH_2Si(OCH_3)_3$, $C_2F_5OCH_2CH_2CH_2Si(OCH_3)_3$, $C_3F_7OCH_2CH_2CH_2Si(OC_2H_5)_3$, $(CF_3)_2CHOCH_2CH_2CH_2Si(OCH_3)_3$, $C_4F_9CH_2OCH_2CH_2CH_2Si(OCH_3)_3$, $H(CF_2)_4CH_2OCH_2CH_2CH_2Si(OCH_3)_3$, 3-(perfluorocyclohexyloxy)propyltrimethoxysilane and so forth.

Examples of the compounds where x=2 include dimethyldimethoxysilane, dimethyldiethoxysilane, methylphenyldimethoxysilane, diethyldimethoxysilane, diethyldiethoxysilane, di-n-propyldimethoxysilane, di-n-propyldiethoxysilane, diisopropyldimethoxysilane, diisopropyldiethoxysilane, diphenyldimethoxysilane, divinyldiethoxysilane, $(CF_3CH_2CH_2)_2Si(OCH_3)_2$, $(C_3F_7OCH_2CH_2)_2Si(OCH_3)_2$, $[H(CF_2)_6CH_2OCH_2CH_2CH_2]_2Si(OCH_3)_2$, $(C_2F_5CH_2CH_2)_2Si(OCH_3)_2$ and so forth.

The polymer used in combination for the sol-gel reaction preferably has a hydrogen bond-forming group. Examples of polymer having a hydrogen bond-forming group include polymers having a hydroxyl group and derivatives thereof (polyvinyl alcohol, polyvinyl acetal, ethylene-vinyl alcohol copolymer, phenol resin, methylol melamine etc. and derivatives thereof); polymers having a carboxyl group and derivatives thereof (homopolymers or copolymers containing units of a polymerizable unsaturated acid such as poly(meth)acrylic acid, maleic anhydride and itaconic acid, esters of these polymers (homopolymers or copolymers containing units of a vinyl ester such as vinyl acetate, (meth)acrylic acid ester such as methyl methacrylate or the like) etc.); polymers having an ether bond (polyalkylene oxide, polyoxyalkylene glycol, polyvinyl ether, silicon resin etc.); polymers having an amide bond (N-acylated polyoxazoline and polyalkyleneimine having a >N(COR)— bond (in the formula, R represents hydrogen atom, an alkyl group which may be substituted or an aryl group which may be substituted)); polyvinylpyrrolidine having a >NC(O)— bond and derivatives thereof; polyurethane having a urethane bond; polymers having a urea bond and so forth.

Further, polymers containing silyl group may also be used as the polymer used in combination in the sol-gel reaction. The polymer containing silyl group comprises a backbone polymer and has at least one, preferably two or more, of silyl groups having a silicon atom bonded to a hydrolyzable group and/or hydroxyl group at the end of the backbone or side chain in one molecule of the polymer. A preferred structure of the silyl group is represented by the following formula.

$$-Si(R^3)_{3-a}(X)_a$$

In the above formula, X represents a hydrolyzable group such as a halogen atom, an alkoxy group, an acyloxy group, aminoxy group, phenoxy group, a thioalkoxy group and an amino group and/or a hydroxyl group, $R^3$ represents hydrogen atom, an alkyl group having 1 to 10 carbon atoms or an aralkyl group having 7 to 10 carbon atoms, and a is an integer of 1 to 3.

As the polymers containing silyl group, vinyl polymers containing silyl group whose backbone comprises a vinyl polymer are particularly preferred. In general, these polymers can be readily synthesized by the following methods. However, the method for producing such polymers is not limited to these methods.

(a) A hydrosilane compound is reacted with a vinyl polymer having a carbon-carbon double bond.

(b) A silane compound represented by the following formula:

$$R^4-Si(R^3)_{3-a}(X)_a$$

(wherein X, $R^3$ and a have the same meanings as defined above, and $R^4$ represents an organic group having a polymerizable double bond) and various vinyl compounds are polymerized.

Examples of the hydrosilane compounds used in the production method described in the above (a) include, for example, halogenated silanes such as methyldichlorosilane, trichlorosilane and phenyldichlorosilane; alkoxysilanes such as methyldiethoxysilane, methyldimethoxysilane, phenyldimethoxysilane, trimethoxysilane and triethoxysilane; acyloxysilanes such as methyldiacetoxysilane, phenyldiacetoxysilane and triacetoxysilane; and aminosilanes such as methyldiaminoxysilane, triaminoxysilane, dimethylaminoxysilane and triaminosilane.

Further, the vinyl polymers used in the production method described in the above (a) are not particularly limited except that vinyl polymers containing hydroxyl group are excluded. Preferred examples thereof include, for example, vinyl polymers obtained by copolymerizing a vinyl compound selected from (meth)acrylic acid esters such as methyl (meth)acrylate, ethyl (meth)acrylate, butyl (meth)acrylate, isobutyl (meth)acrylate, 2-ethylhexyl (meth)acrylate, benzyl (meth)acrylate and cyclohexyl (meth)acrylate; carboxylic acids such as (meth)acrylic acid, itaconic acid and fumaric acid and acid anhydrides such as maleic anhydride; epoxy compounds such as glycidyl (meth)acrylate; amino compounds such as diethylaminoethyl (meth)acrylate and aminoethyl vinyl ether; amide compounds such as (meth)acrylamide, N-tert-butyl(meth)acrylamide, itaconic acid diamide, a-ethylacrylamide, crotonamide, fumaric acid diamide, maleic acid diamide and N-butoxymethyl(meth)acrylamide; acrylonitrile, styrene, vinyltoluene, a-methylstyrene, vinyl chloride, vinyl acetate, vinyl propionate, N-vinylpyrrolidine etc., with a monomer having a double bond in a side chain such as allyl methacrylate.

Moreover, examples of the silane compounds used in the production method described in the above (b) include the compounds described in Japanese Patent Laid-Open Publication No. 2001-42102, Chemical Formula 5.

Further, as the vinyl compounds used in the production method described in the above (b), the vinyl compounds used for the polymerization of the vinyl polymer in the production method of the above (a) can be used. In addition to those mentioned for the production method described in the above (a), vinyl compounds containing a hydroxyl group such as 2-hydroxyethyl (meth)acrylate, 2-hydroxypropyl (meth)acrylate, 2-hydroxyvinyl ether and N-methylolacrylamide can also be used.

Preferred specific examples of the vinyl polymers containing silyl group described above include acrylic polymers containing a trialkoxysilyl group represented by the following formula. The average molecular weight of these vinyl polymers containing silyl group is preferably 2,000 to 100,000, more preferably 4,000 to 50,000.

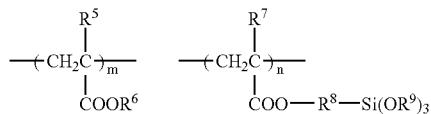

In the above formula, $R^5$ and $R^7$ each independently represent hydrogen atom, fluorine atom or methyl group, $R^6$ represents hydrogen atom, an alkyl group having 1 to 12 carbon atoms (e.g., methyl group, ethyl group, n-propyl group, allyl group, n-butyl group, isobutyl group, n-pentyl group, n-hexyl group, benzyl group, an alkyl group containing a fluorine atom such as $(CF_3)_2CH-$, $CF_3CH_2-$, $C_7F_{15}CH_2-$ and $C_2F_5CH_2CH_2-$, $R^8$ represents an alkylene group having 1 to 4 carbon atoms such as methylene group, ethylene group, propylene group and butylene group, $R^9$ has the same meaning as $R^1$ mentioned above, and $n/(m+n)=0.01$ to 0.4, preferably 0.02 to 0.2.

Specific examples of the vinyl polymers containing silyl group preferably used in the present invention include Kaneka Zemlac produced by Kaneka Corporation and the following polymers. However, vinyl polymers containing silyl group that can be used in the present invention are not limited to these polymers.

Specific examples of the vinyl polymers containing silyl group represented by the aforementioned formula are as follows.

P-1: Methyl methacrylate/γ-acryloxypropyltrimethoxysilane copolymer (80/20 (w/w))

P-2: methyl methacrylate/γ-methacryloxypropyltrimethoxysilane copolymer (85/15 (w/w))

P-3: Methyl methacrylate/ethyl acrylate/γ-methacryloxypropyltrimethoxysilane copolymer (50/40/10 (w/w/w))

P-4: M-1/γ-methacryloxypropyltrimethoxysilane copolymer (90/10 (w/w))

P-5: M-2/γ-methacryloxypropyltrimethoxysilane copolymer (80/20 (w/w))

P-6: M-1/M-3/γ-methacryloxypropyltrimethoxysilane copolymer (50/40/10 (w/w/w))

P-7: Methyl methacrylate/methyl acrylate/γ-acryloxypropyltrimethoxysilane copolymer (60/25/15 (w/w/w))

P-8: M-1/methyl methacrylate/γ-methacryloxypropyltrimethoxysilane copolymer (70/25/5 (w/w/w))

The structural formulas of M-1, M-2 and M-3 are as follows.

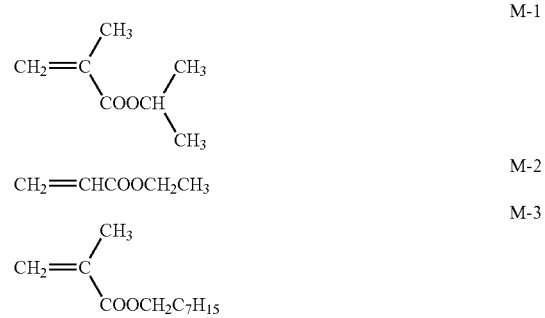

The proportion of the polymer containing silyl group in the composition is 1 to 200% by weight, preferably 3 to 100% by weight, more preferably 5 to 50% by weight, based on the total alkoxysilane used. Further, a monomer may be used together in the sol-gel reaction and polymerized during the sol-gel reaction or thereafter to produce an organic/inorganic hybrid material.

During the sol-gel reaction, the metal alkoxide is hydrolyzed and polymerized by condensation in water or an organic solvent. For this reaction, it is preferable to use a catalyst. As the catalyst for hydrolysis, acids are generally used. As the acids, inorganic acids or organic acids may be used. Examples of the inorganic acids include hydrochloric acid, hydrogen bromide, hydrogen iodide, sulfuric acid, sulfurous acid, nitric acid, nitrous acid, phosphoric acid, phosphorous acid and so forth. Examples of the organic acids include carboxylic acids (formic acid, acetic acid, propionic acid, butyric acid, succinic acid, cyclohexanecarboxylic acid, octanoic acid, maleic acid, 2-chloropropionic, cyanoacetic acid, trifluoroacetic acid, perfluorooctanoic acid, benzoic acid, pentafluorobenzoic acid, phthalic acid etc.), sulfonic acids (methanesulfonic acid, ethanesulfonic acid, trifluoromethanesulfonic acid, p-toluenesulfonic acid, pentafluorobenzenesulfonic acid etc.), phosphoric acids and phosphonic acids (phosphoric acid dimethyl ester, phenylphosphonic acid etc.), Lewis acids (boron trifluoride etherate, scandium triflate, alkyltitanic acid, aluminic acid etc.), heteropolyacids (phosphomolybdic acid, phosphotungstic acid etc.) and so forth.

The amount of the acid used is 0.0001 to 0.05 mol, preferably 0.001 to 0.01 mol, per 1 mol of metal alkoxide (when alkoxysilane and other metal alkoxide are contained, alkoxysilane+other metal alkoxide).

After the hydrolysis, basic compounds such as inorganic bases and amines may be added to adjust pH of the solution to make it close to neutral so that condensation polymerization should be promoted.

As the inorganic bases, sodium hydroxide, potassium hydroxide, calcium hydroxide, magnesium hydroxide, aluminum hydroxide, ammonia and so forth can be used. As the organic base compounds, amines (ethylenediamine, diethylenetriamine, triethylenetetramine, tetraethylenepentamine, triethylamine, dibutylamine, N,N-dimethylbenzylamine, tetramethylethylenediamine, piperidine, piperazine, morpholine, ethanolamine, diazabicycloundecene, quinuclidine, aniline, pyridine etc.) and phosphines (triphenylphosphine, trimethylphosphine etc.) can be used.

Further, it is also preferable to use, after the hydrolysis with acids, in particular, amines described in Japanese Patent Application No. 2002-110061 and represented by the following formula.

In the above formula, $R^1$ and $R^2$ each independently represent hydrogen atom, an aliphatic group, an acyl group, an aliphatic oxycarbonyl group, an aromatic oxycarbonyl group, an aliphatic sulfonyl group or an aromatic sulfonyl group, and $R^3$ represents an aromatic oxy group, an aliphatic thio group, an aromatic thio group, an acyloxy group, an aliphatic oxycarbonyloxy group, an aromatic oxycarbonyloxy group, a substituted amino group, a heterocyclic group or hydroxy group. However, when $R^3$ is not an aromatic group, either $R^1$ or $R^2$ or the both represent hydrogen atom.

In this case, a suitable addition amount of the amine is an equimolar amount to 100 times of the acid in mole, preferably an equimolar amount to 20 times in mole.

Further, other sol-gel catalysts can also be used in combination. Examples thereof will be shown below.

(1) Metal Chelate Compounds

Metal chelate compounds having a metal as the center metal and an alcohol represented by the formula $R^{10}OH$ (wherein $R^{10}$ represents an alkyl group having 1 to 6 carbon atoms) and a diketone represented as $R^{11}COCH_2COR^{12}$ (wherein $R^{11}$ represents an alkyl group having 1 to 6 carbon atoms, and $R^{12}$ represents an alkyl group having 1 to 6 carbon atoms or an alkoxy group having 1 to 16 carbon atoms) as ligands can be suitably used without any particular limitation. Two or more metal chelate compounds may be used in combination so long as they are in this category. Those having Al, Ti or Zr as the center metal are particularly preferred as the metal chelate compounds of the present invention. Those selected from a group of compounds represented by the formulas $Zr(OR^{10})_{p1}(R^{11}COCHCOR^{12})_{p2}$, $Ti(OR^{10})_{q1}(R^{11}COCHCOR^{12})_{q2}$ and $Al(OR^{10})_{r1}(R^{11}COCHCOR^{12})_{r2}$ are preferred, and they have an action of promoting the condensation reaction.

$R^{10}$ and $R^{11}$ in the metal chelate compound may be identical or different, and represent an alkyl group having 1 to 6 carbon atoms, specifically, ethyl group, n-propyl group, isopropyl group, n-butyl group, sec-butyl group, tert-butyl group, n-pentyl group or the like. In addition to the aforementioned alkyl groups having 1 to 6 carbon atoms, $R^{12}$ also represents an alkoxy group having 1 to 16 carbon atoms, for example, methoxy group, ethoxy group, n-propoxy group, isopropoxy group, n-butoxy group, sec-butoxy group, tert-butoxy group, lauryl group, stearyl group or the like. In the metal chelate compound, p1, p2, q1, q2, r1 and r2 are integers determined so as to obtain quadridentate or hexadentate ligands.

Specific examples of the metal chelate compounds include zirconium chelate compounds such as tri-n-butoxy (ethyl acetoacetate) zirconium, di-n-butoxy·bis(ethyl acetoacetate) zirconium, n-butoxy·tris(ethyl acetoacetate) zirconium, tetrakis(n-propyl acetoacetate) zirconium, tetrakis(acetyl acetoacetate) zirconium and tetrakis(ethyl acetoacetate) zirconium; titanium chelate compounds such as diisopropoxy.bis(ethyl acetoacetate) titanium, diisopropoxy.bis (acetyl acetate) titanium and diisopropoxy.bis (acetylacetone) titanium; aluminum chelate compounds such as diisopropoxy(ethyl acetoacetate) aluminum, diisopropoxy(acetyl acetonate) aluminum, isopropoxyz.bis(ethyl acetoacetate) aluminum, isopropoxy.bis(acetyl acetonate) aluminum, tris(ethyl acetoacetate) aluminum, tris(acetyl acetonate) aluminum and monoacetyl acetonate-bis(ethyl acetoacetate) aluminum and so forth. Among these metal chelate compounds, tri-n-butoxy(ethyl acetoacetate) zirconium, diisopropoxy.bis(acetyl acetonate) titanium, diisopropoxy(ethyl acetoacetate) aluminum and tris(ethyl acetoacetate) aluminum are preferred. These metal chelate compounds can be used in each kind or two or more kinds of them can be used in combination. Further, partial hydrolysates of these metal chelate compounds can also be used.

(2) Organic Metal Compounds

Although preferred organic metal compounds are not particularly limited, organic transition metal compounds are preferred because of their high activity. Among these, tin compounds are particularly preferred since their stability and activity are favorable. Specific examples of these compounds include organic tin compounds including carboxylic acid type organic tin compounds such as $(C_4H_9)_2Sn(OCOC_{11}H_{23})_2$, $(C_4H_9)_2Sn(OCOCH=CHCOOC_4H_9)_2$, $(C_8H_{17})_2Sn(OCOC_{11}H_{23})_2$, $(C_8H_{17})_2Sn(OCOCH=CHCOOC_4H_9)_2$ and $Sn(OCOCC_8H_{17})_2$; mercaptide type or sulfide type organic tin compounds such as $(C_4H_9)_2Sn(SCH_2COOC_8H_{17})_2$, $(C_8H_{17})_2Sn(SCH_2CH_2COOC_8H_{17})_2$, $(C_8H_{17})_2Sn(SCH_2COOC_{12}H_{25})_2$,

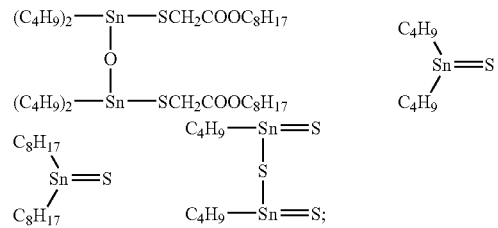

$(C_4H_9)_2SnO$, $(C_8H_{17})_2SnO$ and reaction products of an organic tin oxide such as $(C_4H_9)_2SnO$ and $(C_8H_{17})_2SnO$ and an ester compound such as ethyl silicate, dimethyl maleate, diethyl maleate and dioctyl phthalate, and so forth.

(3) Metal Salts

As the metal salts, alkaline metal salts of organic acids (for example, sodium naphthenate, potassium naphthenate, sodium octanoate, sodium 2-ethylhexanoate, potassium laurate etc.) are preferably used.

The proportion of the sol-gel catalyst compound in the composition is 0.01 to 50% by weight, preferably 0.1 to 50% by weight, more preferably 0.5 to 10% by weight, based on the alkoxysilane, which is a raw material of the sol solution.

Solvents used in the sol-gel reaction will be explained below. The solvents allow all ingredients in the sol solution to be uniformly mixed, thereby make it possible to prepare solid matter in the composition of the present invention and use various coating methods, and improve dispersion stability and storage stability of the composition. These solvents are not particularly limited so long as they can achieve the aforementioned objects. Preferred examples of the solvents include, for example, water and organic solvents showing high water-miscibility.

Examples thereof include tetrahydrofuran, dimethoxyethane, formic acid, acetic acid, methyl acetate, alcohols (methanol, ethanol, n-propyl alcohol, isopropyl alcohol, tert-butyl alcohol), ethylene glycol, diethylene glycol, triethylene glycol, ethylene glycol monobutyl ether, acetic acid ethylene glycol monoethyl ether, acetone, N,N-dimethylformamide, N,N-dimethylacetamide, dimethyl sulfoxide and so forth.

In order to adjust the sol-gel reaction rate, organic compounds that can constitute multidentate ligands may be added to stabilize the metal alkoxide. Examples thereof include β-diketones and/or β-ketoesters and alkanolamines.

Specific examples of the β-diketones and/or β-ketoesters include acetylacetone, methyl acetoacetate, ethyl acetoacetate, n-propyl acetoacetate, isopropyl acetoacetate, n-butyl acetoacetate, sec-butyl acetoacetate, tert-butyl acetoacetate, 2,4-hexanedione, 2,4-heptanedione, 3,5-heptanedione, 2,4-octanedione, 2,4-nonanedione, 5-methylhexanedione and so forth. Among these, ethyl acetoacetate and acetylacetone are preferred, and acetylacetone is particularly preferred. One kind of these β-diketones and/or β-ketoesters can solely be used, or two or more kinds of these can be used in combination.

When the aforementioned metal chelate compounds are used as sol-gel catalysts, these compounds that can be multidentate ligands can also be used to adjust the reaction rate.

The gas barrier film of the present invention may have an inorganic thin film layer between the film of the present invention and the organic/inorganic hybrid layer obtained by the sol-gel method. As such an inorganic thin film layer, an inorganic vapor deposition layer or a dense inorganic coating thin film obtained by the sol-gel method is preferred. As the inorganic vapor deposition layer, vapor deposition layers of silica, zirconia, alumina and so forth are preferred. The inorganic vapor deposition layer can be formed by vacuum vapor deposition, sputtering method or the like.

A method for coating an organic/inorganic hybrid layer obtained by the sol-gel method will be described below. A sol solution can be used to form a thin film on the film of the present invention by using a coating method such as curtain flow coating, dip coating, spin coating or roll coating. In this case, the timing of hydrolysis may be at any time during the production process. For example, there can be suitably used a method in which a solution having a required composition is hydrolyzed and partially condensed to prepare a desired sol solution beforehand, and then it is applied and dried, a method in which a solution having a required composition is prepared and applied and dried while being simultaneously hydrolyzed and partially condensed, a method in which, after a solution is coated and primarily dried, a water-containing solution necessary for hydrolysis is overlaid to attain the hydrolysis, and so forth. Further, various application methods can be used. When productivity is emphasized, a method in which the discharge flow rates of a lower layer coating solution and an upper layer coating solution are adjusted in a slide geeser having multiple discharge ports so that required coating amounts of the solutions should be obtained, and the formed multilayer flows are continuously placed on the film of the present invention (support) and dried (simultaneous multilayer coating method) is preferably used.

Although temperature for drying after the coating is not particularly limited so long as it is in such a range that the film of the present invention should not be deformed, it is preferably 150° C. or lower, more preferably 30° C. to 150° C., particularly preferably 50° C. to 130° C.

In order to make the gas barrier film after the coating and drying further denser, irradiation of energy beam may be performed. Although type of the irradiation beam is not particularly limited, irradiation of ultraviolet rays, electron beams or microwaves can be particularly preferably used in view of influence on deformation and degeneration of the support. The irradiation intensity is 30 to 500 mJ/cm$^2$, particularly preferably 50 to 400 mJ/cm$^2$. The irradiation temperature may be selected from the range of from room temperature to the temperature at which the support begins to deform without any particular limitation, and it is preferably 30° C. to 150° C., particularly preferably 50° C. to 130° C.

The gas barrier film of the present invention has the organic/inorganic hybrid layer obtained by the sol-gel method on the aforementioned film, and it can further have a film comprising a polymer on the organic/inorganic hybrid layer.

The polymer constituting the film comprising a polymer is not particularly limited, and various kinds of thermoplastic resins, thermosetting resins and so forth can be used. The film comprising a polymer is preferably the film of the present invention.

As for layer structure, the gas barrier film of the present invention has a layer structure wherein an organic/inorganic hybrid layer obtained by the sol-gel method is provided on the film of the present invention, or a layer structure wherein a film comprising a polymer is further provided on such an organic/inorganic hybrid layer provided on the film of the present invention. In order to obtain favorable gas barrier property, the organic/inorganic hybrid layer in the gas barrier film of the present invention preferably has a thickness of 0.1 to 5 μm, more preferably 0.1 to 2 μm. The film comprising a polymer provided on the organic/inorganic hybrid layer preferably has a thickness of 10 to 300 μm, more preferably 25 to 100 μm.

The method for producing the gas barrier film of the present invention is not particularly limited. For example, it can be produced by a method of coating an organic-inorganic hybrid layer on the film of the present invention and then further coating a film comprising a polymer, a method of adhering a film comprising a polymer to the organic/inorganic hybrid layer or the like. When the film comprising a polymer is the film of the present invention, the gas barrier film of the present invention can also be produced by bonding the films of the present invention each coated with an organic/inorganic hybrid layer on the organic/inorganic hybrid layer side.

[Substrate]

The substrate of the present invention has the film of the present invention or the gas barrier film of the present invention. The substrate of the present invention can be used as, for example, a substrate for display device, a substrate for electronic circuit or the like. When the substrate of the present invention is used as a substrate for display device, electrodes, dielectric layer, protective layer, partitions, fluorophore and so forth can be formed on the film of the present invention or the gas barrier film of the present invention to obtain a member for display device, and displays such as PDP, PALC, FED, and VFD can be further produced by using the member. When the substrate of the present invention is used as a substrate for electronic circuit, a circuit can be formed on the film of the present invention or the gas barrier film of the present invention to produce an electronic circuit used for various kinds of electronic equipments and semiconductor devices. Further, the substrate of the present invention can be used as a substrate for solar cell, electronic paper, other various products aiming at portable use and so forth.

[Image Display Device]

The image display device of the present invention is a liquid crystal device, organic EL device or the like having the film, gas barrier film or substrate of the present invention.

The organic EL device of the present invention is preferably used according to any of the embodiments described in Japanese Patent Laid-Open Publication Nos. 11-335661, 11-335368, 2001-192651, 2001-192652, 2001-192653, 2001-335776, 2001-247859, 2001-181616 and 2001-181617, Japanese Patent Application Nos. 2001-58834, 2001-58835, 2001-89663 and 2001-334858.

That is, the film of the present invention or the gas barrier film of the present invention can be used as a base material film and/or a protective film in an organic EL device having the film of the present invention or the gas barrier film of the present invention. When the gas barrier film of the present invention is used in the organic EL device of the present invention, it is preferable to coat the organic/inorganic hybrid layer obtained by the sol-gel method on the EL layer side, i.e., the side that is not brought into contact with outside air.

EXAMPLES

The present invention will be further specifically explained with reference to the following examples of the present invention. The materials, amounts, ratios, types and procedures of treatments and so forth shown in the following examples can be suitably changed unless such changes depart from the spirit of the present invention. Accordingly, the scope of the present invention should not be construed as limited to the following specific examples.

Examples 1 to 8

Preparation of Support

ZEONOA 1600R (Tg: 163° C., cycloolefin polymer produced by Nippon Zeon) was mixed per 100 parts by weight with 10 parts by weight of Somasif ME-100 (synthetic swelling mica produced by CO-OP CHEMICAL) organophilized with P-3, P-4, P-6, P-7, N-3, N-6, N-9 and N-11 shown in Table 1 (surface treatment), then kneaded and extruded at 270° C. by using a double screw extruder (Rheomix 600P/PTW25, HAAKE, Germany) to obtain Films 1A (Example 1) to 1H (Example 8) having a thickness of 200 μm.

Comparative Example 1

Film C1 was produced in the same manner as Example 1 except that Somasif ME-100 organophilized in Example 1 was not added.

Comparative Example 2

Film C2 was obtained in the same manner as Example 1 except that a compound disclosed in Japanese Patent Laid-open Publication No. 2001-302888 (distearyldimethylammonium chloride (DSDM)) was used instead of the organophilizing agents used in Example 1 (P-3 to N-11) and a support was prepared according to the method described in the above patent document.

Test Example 1

Gas Barrier Property Test

The gas transmission rate of the obtained Films 1A to 1H, C1 and C2 was measured by the MOCON method. The results are shown in Table 1.

TABLE 1

| | Sample | Organophilizing agent | Oxygen transmission rate at 23° C., 0% RH ($ml/m^2 \cdot day \cdot atm$) | Water vapor transmission rate at 23° C., 90% RH ($g/m^2 \cdot day$) |
|---|---|---|---|---|
| Example 1 | 1A | P-3 | 28 | 0.12 |
| Example 2 | 1B | P-4 | 27 | 0.10 |
| Example 3 | 1C | P-7 | 26 | 0.11 |
| Example 4 | 1D | P-6 | 22 | 0.10 |
| Example 5 | 1E | N-3 | 38 | 0.21 |
| Example 6 | 1F | N-6 | 39 | 0.22 |
| Example 7 | 1G | N-9 | 39 | 0.21 |
| Example 8 | 1H | N-11 | 38 | 0.21 |
| Comparative Example 1 | C1 | R-1[*1)] | 185 | 1.02 |
| Comparative Example 2 | C2 | Not added | 150 | 0.41 |

[*1)]Organophilizing agent described in Japanese Patent Laid-open Publication No. 2001-302888.

As seen from the results shown in Table 1, all of the films of the present invention (Examples 1 to 8) showed significantly smaller oxygen transmission rate and water vapor transmission rate compared with Comparative Examples 1 and 2.

Thus, it can be seen that the films of the present invention had improved gas barrier property and improved corrosion resistance compared with the film containing the layered silicate undergone ion exchange with the conventional organophilizing agent (Comparative Example 1) and the film containing the layered silicate not undergone ion exchange with organophilizing agent (Comparative Example 2).

Heat Resistance Test

Tg of the obtained Films 1C, 1F and C2 was measured by the dynamic tension viscoelasticity test method. As a result, Tg of Film 1C was 168° C., Tg of Film 1F was 142° C. On the other hand, Tg of Film C2 was 116° C.

Further, linear thermal expansion coefficient of Films 1C, 1F and C2 was obtained by TMA. As a result, it was 12 ppm/° C. for Film 1C and 18 ppm/° C. for Film 1F. On the other hand, it was 35 ppm/° C. for Film C2.

From the above results, it can be seen that the film comprising the polymer composition of the present invention showed improved heat resistance compared with the films comprising a polymer as a simple substance because Tg was increased and the linear thermal expansion coefficient was decreased.

Examples 9 to 15

Formation of Organic/Inorganic Hybrid Coating Layer by Sol-Gel Method

In an amount of 8 g of SOARNOL D2908 (ethylene/vinyl alcohol copolymer produced by Nippon Synthetic Chemical Industry) was dissolved in a mixed solvent of 118.8 g of 1-propanol and 73.2 g of water at 80° C. In an amount of 10.72 g of this solution was added and mixed with 2.4 ml of 2 N hydrochloric acid. This solution was added dropwise with 1 g of tetraethoxysilane with stirring and further stirred for 30 minutes. The obtained solution was applied to the films mentioned in Table 2 prepared in the same manners as in Examples 1 to 8 by using a wire bar. Then, each coated mixture was dried at 120° C. for 5 minutes to form an organic/inorganic hybrid layer having a film thickness of about 1 μm on each film.

Bonding of Films

The organic/inorganic hybrid layers of the films each having an organic/inorganic hybrid layer produced as described above were bonded by lamination to prepare Samples 2A to 2G.

Comparative Examples 3 and 4

Samples of Comparative Examples 3 and 4 were prepared in the same manner as in Example 9 except that Film C3 or C4 was used instead of Film 2A used in Example 9.

Test Example 2

Gas Barrier Property Test

The gas transmission rate of Samples 2A to 2F, C3 and C4 was measured by the MOCON method. The results are shown in Table 2.

showed lower water vapor transmission rate compared with Comparative Examples 3 and 4.

Thus, it can be seen that the gas barrier films of the present invention have improved gas barrier property and improved corrosion resistance compared with the film using the layered silicate undergone ion exchange with the conventional organophilizing agent and the film using the layered silicate not undergone ion exchange with organophilizing agent (Comparative Examples 3 and 4).

Example 16

Production of Organic EL Device

Sample 2C was introduced into a vacuum chamber, and a transparent electrode made of an IXO thin film having a thickness of 0.2 μm was formed by DC magnetron sputtering using an IXO target. An aluminum lead wires was connected to the transparent electrode (IXO) to form a laminated structure.

An aqueous dispersion of polyethylene dioxythiophene/polystyrenesulfonic acid (Baytron P, BAYER, solid content: 1.3 weight %) was applied on the surface of the transparent electrode by spin coating and vacuum-dried at 150° C. for 2 hours to form a hole transporting organic thin film layer having a thickness of 100 nm. This was designated as Substrate X.

Further, a coating solution for light-emitting organic thin film layer having the following composition was applied on one side of a temporary support made of polyethersulfone having a thickness of 188 μm (SUMILITE FS-1300, Sumitomo Bakelite) by using a spin coater and dried at room temperature to form a light-emitting organic thin film layer having a thickness of 13 nm on the temporary support. This was designated as Transfer Material Y.

| Polyvinyl carbazole (Mw = 63000, Aldrich) | 40 parts by weight |
|---|---|
| Tris(2-phenylpyridine) iridium complex (Ortho-metalated complex) | 1 part by weight |
| Dichloroethane | 3200 parts by weight |

TABLE 2

| | Sample | Organo-philizing agent | Oxygen transmission rate (ml/m² · day · atm) | | Water vapor transmission rate at 23° C., 90% RH (g/m² · day) |
|---|---|---|---|---|---|
| | | | 23° C., 0% RH | 23° C., 90% RH | |
| Example 9 | 2A | P-1 | 0.05 | 0.54 | 0.08 |
| Example 10 | 2B | P-2 | 0.04 | 0.58 | 0.05 |
| Example 11 | 2C | P-6 | 0.03 | 0.55 | 0.06 |
| Example 12 | 2D | P-7 | 0.04 | 0.52 | 0.06 |
| Example 13 | 2E | N-1 | 0.05 | 0.63 | 0.11 |
| Example 14 | 2F | N-6 | 0.06 | 0.64 | 0.12 |
| Example 15 | 2G | N-13 | 0.05 | 0.61 | 0.13 |
| Comparative Example 3 | C3 | R-1*[1] | 0.06 | 0.88 | 0.18 |
| Comparative Example 4 | C4 | Not added | 0.10 | 20.7 | 0.20 |

*[1]Organophilizing agent described in Japanese Patent Laid-open Publication No. 2001-302888.

As seen from the results shown in Table 2, all of the gas barrier films of the present invention (Examples 9 to 15) showed improved oxygen transmission rate at 0% and 90% RH at 23° C. compared with Comparative Examples 3 and 4. Further, the gas barrier films of the present invention The light-emitting organic thin film layer side of Transfer Material Y was overlaid on the upper surface of the organic thin film layer of Substrate X, heated and pressurized at 160° C., 0.3 MPa and 0.05 m/min by using a pair of heat rollers, and the temporary support was delaminated to form a light-emitting organic thin film layer on the upper surface of Substrate X. This was designated as Substrate XY.

Further, a patterned mask for vapor deposition (mask providing a light-emitting area of 5 mm×5 mm) was set on one side of a polyimide film (UPILEX-50S, Ube Industries) cut into a 25-mm square and having a thickness of 50 μm, and Al was vapor-deposited in an atmosphere under reduced pressure of about 0.1 mPa to form an electrode having a film thickness of 0.3 μm. $Al_2O_3$ was vapor-deposited in the same pattern as that of the Al layer by DC magnetron sputtering using an $Al_2O_3$ target to obtain a film thickness of 3 nm. An aluminum lead wire was connected to the Al electrode to form a laminated structure. A coating solution for an electron transporting organic thin film layer having the following composition was applied on the obtained laminated structure by using a spin coater and vacuum-dried at 80° C. for 2 hours to form an electron transporting organic thin film layer having a thickness of 15 nm on LiF. This was designated as Substrate Z.

| | |
|---|---|
| Polyvinyl butyral (Mw = 2000, 2000 L produced by Denki Kagaku Kogyo) | 10 parts by weight |
| 1-Butanol | 3500 parts by weight |
| Electron transporting compound having the following structure | 20 parts by weight |

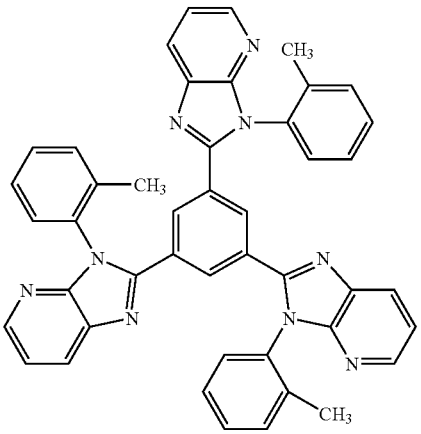

Substrate XY and Substrate Z were stacked so that the electrodes should face each other via the light-emitting organic thin film layer between them, heated and pressurized at 160° C., 0.3 MPa and 0.05 m/min by using a pair of heat rollers to obtain Organic EL Device 1.

Comparative Example 5

Organic EL Device 2 was obtained in the same manner as in Example 16 except that Sample C1 was used as the support instead of Sample 2C in the production of Substrate X in Example 16.

Test Example 3

DC voltage was applied to the obtained Organic EL Devices 1 and 2 by using Source-Measure Unit Type 2400 (Toyo Corporation) to allow them to emit light.

Both of Organic EL Devices 1 and 2 favorably emitted light immediately after the manufacture.

Three months after the manufacture of Devices 1 and 2, they were similarly allowed to emit light. Favorable light emission was similarly observed in Device 1 as immediately after the manufacture, whereas Organic EL Device 2 showed increased defects.

The results show that stable luminescence can be obtained with an organic EL device having the gas barrier film of the present invention even in an operation environment of ordinary organic EL devices.

As explained above, the polymer composition of the present invention comprises a polymer having Tg of 120° C. to 400° C. as a simple substance of the polymer and an organic modified layered silicate having a decomposition starting temperature of 190° C. to 350° C. contained in the polymer. Thus, by using the polymer composition of the present invention, a film and gas barrier film having both of superior heat resistance and superior gas barrier property can be provided. Further, by using this gas barrier film, a substrate and image display device exhibiting superior precision and superior durability can be provided.

The present disclosure relates to the subject matter contained in Japanese Patent Application No. 274037/2002 filed on Sep. 19, 2002, which is expressly incorporated herein by reference in its entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. A film consisting of a polymer composition comprising a polymer having a glass transition temperature of 120° C. to 400° C. as a simple substance of the polymer and an organic modified layered silicate having a decomposition starting temperature of 250° C. to 350° C.,
   wherein the polymer is selected from the group consisting of polycarbonates, cycloolefin polymers, polyalylates, polyether sulphones and olefin metathesis polymers, and
   the organic modified layered silicate is contained in the polymer,
   with the proviso that when the polymer is a polycarbonate, the organic modified layered silicate contains a tetraalkylphosphonium compound or a quaternary salt of a nitrogen-containing heterocyclic compound.

2. The film according to claim 1, wherein the polymer has a glass transition temperature of 160° C. to 300° C.

3. The film according to claim 1, wherein the polymer has a glass transition temperature of 180° C. to 250° C.

4. The film according to claim 1, wherein the polymer is an olefin metathesis polymer.

5. The film according to claim 4, wherein the olefin metathesis polymer is prepared by olefin metathesis reaction of a norbornene type monomer.

6. The film according to claim 4, wherein the olefin metathesis polymer is prepared by olefin metathesis reaction of a monocyclic cycloolefin type monomer.

7. The film according to claim 1, wherein the organic modified layered silicate has a decomposition starting temperature of 250° C. to 300° C.

8. The film according to claim 1, wherein the organic modified layered silicate contains a quaternary salt of nitrogen-containing or heterocyclic compound.

9. A substrate comprising the film of claim 1.

10. An image display device comprising the film of claim 1.

11. The image display device according to claim 10, wherein the device is an organic EL device.

12. A gas barrier film comprising a film consisting of a polymer composition comprising a polymer having a glass transition temperature of 120° C. to 400° C. as a simple substance of the polymer and an organic modified layered silicate having a decomposition starting temperature of 250° C. to 350° C.,
   wherein the polymer is selected from the group consisting of polycarbonates, cycloolefin polymers, polyalylates, polyether sulphones and olefin metathesis polymers,
   the organic modified layered silicate is contained in the polymer and
   an organic/inorganic hybrid layer wherein the organic/inorganic hybrid layer is formed on the film by the sol-gel method,
   with the proviso that when the polymer is a polycarbonate, the organic modified layered silicate contains a tetraalkylphosphonium compound or a quaternary salt of a nitrogen-containing heterocyclic compound.

13. The gas barrier film according to claim 12, which further has a film comprising a polymer on the organic/inorganic hybrid layer.

14. The gas barrier film according to claim 13, wherein the film comprising a polymer consists of a polymer composition comprising a polymer having a glass transition temperature of 120° C. to 400° C. as a simple substance of the polymer and an organic modified layered silicate having a decomposition starting temperature of 250° C. to 350° C. wherein the organic modified layered silicate is contained in the polymer.

15. The gas barrier film according to claim 13, which shows a gaseous oxygen transmission rate of 10 ml/m$^2$·day·atm or less at 23° C., 90% RH.

* * * * *